United States Patent
Bo et al.

(10) Patent No.: US 9,343,468 B1
(45) Date of Patent: May 17, 2016

(54) FEED-FORWARD BIDIRECTIONAL IMPLANTED SPLIT-GATE FLASH MEMORY CELL

(71) Applicant: Texas Instruments Incorporated, Dallas, TX (US)

(72) Inventors: Xiangzheng Bo, Plano, TX (US); Douglas Tad Grider, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/669,886

(22) Filed: Mar. 26, 2015

(51) Int. Cl.
| | |
|---|---|
| *G11C 16/04* | (2006.01) |
| *H01L 27/115* | (2006.01) |
| *G11C 16/26* | (2006.01) |
| *H01L 29/423* | (2006.01) |
| *H01L 29/788* | (2006.01) |
| *H01L 29/49* | (2006.01) |
| *H01L 21/66* | (2006.01) |
| *H01L 21/265* | (2006.01) |
| *H01L 21/285* | (2006.01) |
| *H01L 29/45* | (2006.01) |

(52) U.S. Cl.
CPC ...... *H01L 27/11521* (2013.01); *G11C 16/0441* (2013.01); *G11C 16/26* (2013.01); *H01L 21/26586* (2013.01); *H01L 21/28518* (2013.01); *H01L 22/20* (2013.01); *H01L 29/42328* (2013.01); *H01L 29/45* (2013.01); *H01L 29/495* (2013.01); *H01L 29/4916* (2013.01); *H01L 29/4966* (2013.01); *H01L 29/7883* (2013.01)

(58) Field of Classification Search
CPC .......... G11C 7/12; G11C 16/10; G11C 16/12; G11C 11/34
See application file for complete search history.

(56) References Cited

U.S. PATENT DOCUMENTS

| 5,659,504 | A  | * | 8/1997  | Bude ..................... G11C 16/10 365/185.12 |
| 6,194,272 | B1 | * | 2/2001  | Sung ................. H01L 21/28273 257/E21.422 |
| 6,482,660 | B2 |   | 11/2002 | Conchieri et al. |
| 6,784,039 | B2 |   | 8/2004  | Hsieh |
| 2009/0020800 | A1 | * | 1/2009 | Tempel ............. H01L 21/28273 257/316 |
| 2014/0091380 | A1 | * | 4/2014 | Hong ................ H01L 29/42328 257/314 |
| 2014/0097480 | A1 | * | 4/2014 | Shum ................ H01L 27/11521 257/314 |
| 2015/0117117 | A1 | * | 4/2015 | La Rosa ............ H01L 21/28273 365/185.29 |

* cited by examiner

*Primary Examiner* — Tuan T Nguyen
(74) *Attorney, Agent, or Firm* — Jacqueline J. Garner; Frank D. Cimino

(57) ABSTRACT

A split-gate flash memory cell (cell) includes a semiconductor surface. A first control gate (CG) on a first floating gate (FG) and a second CG on a second floating gate (FG) are on the semiconductor surface. A common source or common drain is between the first and second FG. A first select gate and a second select gate on a select gate dielectric layer is between a first BL source or drain (S/D) and the first FG and between a second BL S/D and the second FG, respectively. The first select gate has a first pocket region that has a first doping distribution different from a second doping distribution in a second pocket region associated with the second select gate which reduces a variation in read current (Ir) for the cell between measuring Ir using the first select gate and measuring Ir using the second select gate.

12 Claims, 5 Drawing Sheets

FEED-FORWARD BIDIRECTIONAL IMPLANTED SPLIT-GATE FLASH MEMORY CELL

FIELD

Disclosed embodiments relate to split-gate flash memory cells.

BACKGROUND

Flash memory is an improved version of electrically erasable, programmable read-only memory (EEPROM) which is capable of block-by-block erasing. Flash memory is used in a variety of applications that require programmability with no loss of memory data during power down (non-volatility). Split-gate flash memory cells have been widely used in the semiconductor industry due to low leakage controlled by a word line (WL) or select gate transistor generally comprising doped polysilicon, lower program current, higher endurance and improved data retention.

A particular flash memory cell is known in the art as a split-gate flash cell that comprises 2 side-by-side transistor structures that share a common source (or drain) region that is in the middle of the flash memory cell. In a split-gate flash cell, the select gate is formed to both couple voltage onto the FG and to control a channel region of the transistor. To accomplish these purposes, the select gate is physically formed directly overlying the substrate and overlying, or next to, the FG. Split-gate flash cells are widely used in semiconductor industry due to its advantage (over convention flash cells) of lower leakage controlled by select gate transistor, lower program current, higher endurance and improved data retention.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include split-gate flash memory cells (split-gate flash cells that comprise a substrate having a semiconductor surface, a first control gate (CG) on a first floating gate (FG) and a second CG on a second floating gate (FG) each on a tunnel gate dielectric layer on the semiconductor surface. A common source or common drain in the semiconductor surface is between the first FG and second FG. A first select gate and a second select gate are on a select gate dielectric layer between a first BL source or drain (S/D) in the semiconductor surface and the first FG and between a second BL S/D in the semiconductor surface and the second FG, respectively. The first select gate has a first pocket region that has a first doping distribution different from a second doping distribution in a second pocket region associated with the second select gate which reduces a variation in read current (Ir) for the split-gate flash cell between measuring Ir using the first select gate and measuring Ir using the second select gate.

BRIEF DESCRIPTION OF THE DRAWINGS

Reference will now be made to the accompanying drawings, which are not necessarily drawn to scale, wherein.

DETAILED DESCRIPTION

Figure 1:
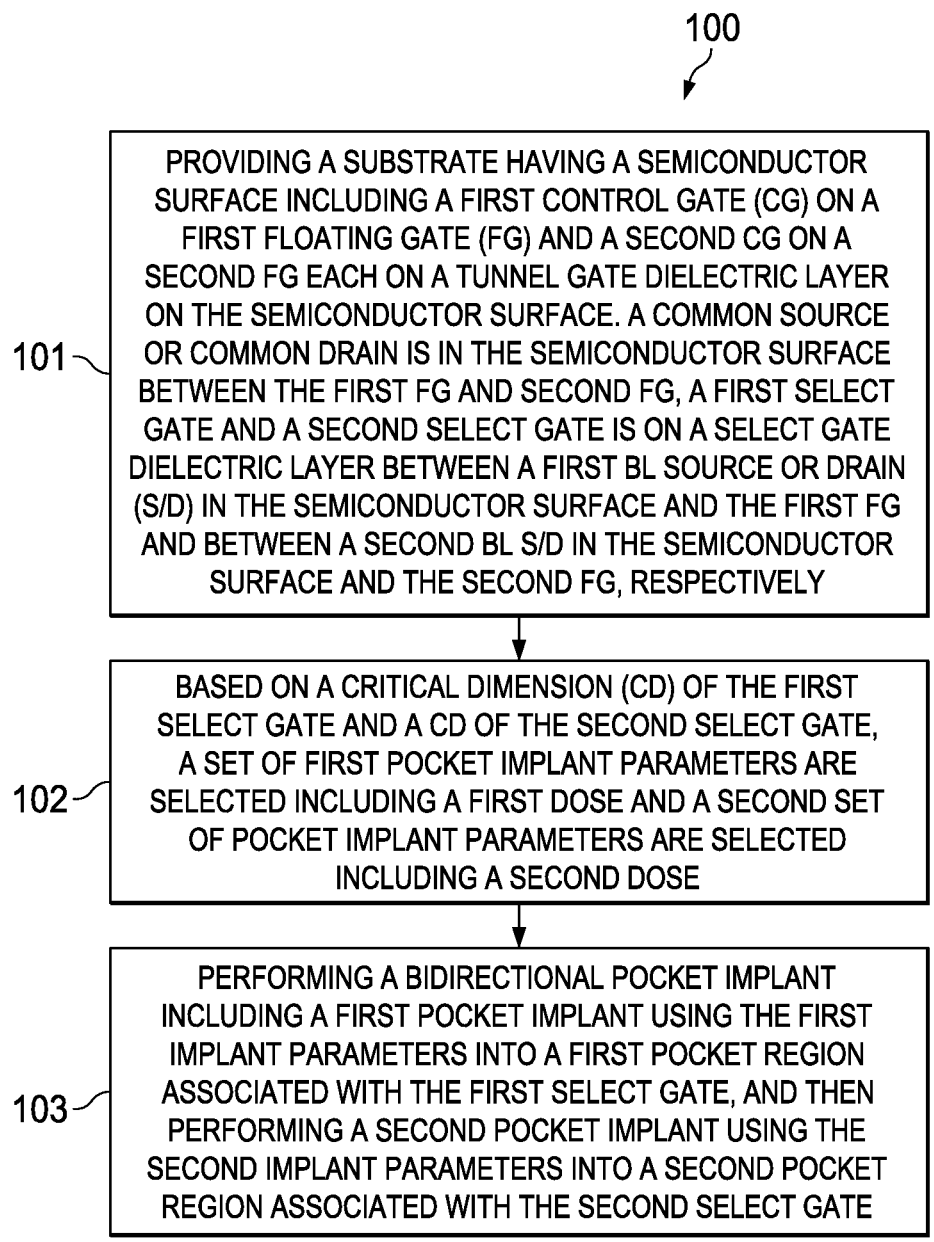
FIG. 1 is a flow chart that shows steps in an example method for fabricating a feed-forward bidirectional pocket implanted split-gate flash cell, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Disclosed embodiments recognize with split-gate flash cells being scaled down in size, the select gate length becomes shorter, and thus more susceptible to process variation, such as to gate length variation between the respective select gates on opposite ends of the cell (referred to herein as even/odd select gates, and their length difference an even/odd select gate critical dimension (CD) variation) as well as implant doping variation for implants that influence the select gate threshold voltage (Vt). Broadening of the select gate Vt distribution within the die and die-to-die across the substrate (e.g., wafer) translates into a larger reading current (Ir) distribution within the die and die-to-die across the substrate, as well as reduced flash circuit design margins.

A known solution used in split-gate flash cell integration to reduce even/odd select gate CD variation is to tighten the WL photo-alignment margin, such as by employing improved lithography apparatus. However, it is recognized that known tightening of the select gate photo alignment margin is limited in effectiveness because the alignment margin cannot be made to be zero so that the even/odd select flash cell CD difference generally always exists.

Disclosed methods utilize even/odd select gate CD in-line process control data that is fed-forward for determining the bidirectional pocket implants to compensate for select gate CD alignment margin. Flash orientation is recognized to be restricted to 1 direction which enables a 2-rotation implant. The implant parameters (dose, energy and/or angle) for the even select gate side and for odd select gate side of the split-gate flash cell can be tuned respectively based on in-line even/odd select gate CD data, with different implant parameters for each of the 2 rotations used as compensation for the even/odd select gate CD difference. Tightened erase split-gate flash cell Ir results from disclosed bidirectional pocket implants which improves flash design and process margins.

Disclosed embodiments can generally be applied to all source or drain center-shared split-gate flash cell devices.

FIG. 1 is a flow chart that shows steps in an example method 100 for fabricating a feed-forward bidirectional pocket implanted split-gate flash cell, according to an example embodiment. The split-gate flash cell can be based on either n-channel metal-oxide semiconductor (NMOS) or p-channel MOS (PMOS) transistors. Although NMOS transistors may generally be described herein, it should be clear to one having ordinary skill in the art to use this information for PMOS transistors as well, by n-doped regions being substituted by p-doping and vice versa. Disclosed embodiments can be applied to NOR or NAND-based flash memory designs which allow different pocket implants to be used for respective pocket regions of the split-gate flash cell.

Step 101 comprises providing a substrate having a semiconductor surface including a first CG on a first FG and a second CG on a second FG each on a tunnel gate dielectric layer on the semiconductor surface. The tunnel gate dielectric layer 211, such as a dielectric oxide layer, may be between about 50 Angstroms and 120 Angstroms in thickness. The tunnel gate dielectric layer is selected to be relatively thin to allow charge transfer to the FGs above during programming or erasing, but thick enough to provide good charge retention during non-programming and non-erasing operation. Because the FGs are electrically isolated by their tunnel gate dielectric layer from the semiconductor surface, electrons reaching it are trapped until they are removed by another application of electric field (e.g., an applied voltage or ultraviolet (UV) light as in EPROM).

A common source or common drain is in the semiconductor surface between the first CG/FG and second CG/FG, and a first select gate and a second select gate is on a select gate dielectric layer between a first BL source or drain (S/D) in the semiconductor surface and the first FG and between a second BL S/D in the semiconductor surface and the second FG, respectively. The substrate can comprise silicon, silicon-germanium, or other semiconductor materials including III-V or II-VI materials, and can comprise a bulk substrate or an epitaxial layer on a bulk substrate. One particular arrangement is a silicon/germanium (SiGe) semiconductor surface on a silicon substrate.

The first CG, first FG, first select gate, second CG, second FG and second select gate can all comprise polysilicon gates. However, other possible gate materials include metals for metal comprising gates for the CGs, FGs and select gates. During a typical process integration, the select gates (e.g., polysilicon gates) are formed after the formation of the CG/FG stacks.

In step 102, based on a CD of the first select gate and a CD of the second select gate, a set of first pocket implant parameters are selected including a first dose, and a second set of pocket implant parameters are selected including a second dose. It is also possible to use select gate misalignment data instead of select gate CD data to determine the pocket implant parameters, where the select gate misalignment data can be translated to select gate CD data to determine the respective pocket implant parameters. In wafer fab, an empirical correlation can be established between misalignment and CD. If misalignment CD is zero, even/odd select gate CD's are the same at "xx" nanometer. If the misalignment to odd select gate direction is "yy" nanometer, then the odd select gate CD is "xx+yy" nm, and even select gate CD is "xx−yy" nm.

The pocket implant parameters can be at least one of the dose which is generally different, implant energy and implant angle. A p-type dopant (generally Boron) is used for pockets for NMOS devices. It is noted the pocket implant dose has been found to have a clear correlation with select gate CD to the flash cell Ir, and the pocket dose can be easily controlled and precisely manipulated within a small range by modern ion implantation equipment. A typical pocket implant dose range is from $5\times10^{12}$ to $1\times10^{14}$ cm$^{-2}$, a typical pocket implant energy is generally from 10 KeV to 50 KeV, and a typical implant angle is from 15 to 45 degrees (measured relative to the semiconductor surface associated with the even or odd select gates being implanted).

Step 103 comprises performing a bidirectional pocket implant including a first pocket implant using the first implant parameters into a first pocket region associated with the first select gates, and performing a second pocket implant using the second implant parameters into a second pocket region associated with the second select gates. The first pocket implant is at a first direction to form the first pocket region and the second pocket implant is at a second (different) direction to form the second pocket region. The respective pocket implants are angled sufficiently, such as between 15 and 50 degree, so that the respective pocket implants are physically blocked (or shadowed) by one select gate of the split-gate flash cells (e.g. polysilicon gates), such as the even select gates of the split-gate flash cells while pocket implanting the other set of select gates such as the odd select gates of the split-gate flash cells. For a process for fabricating an IC including flash memory and periphery CMOS circuitry, during the process of flash LDD and pocket implants the periphery CMOS is generally masked by photoresist so that the flash LDD and pocket implants are only going to the channel regions of the split-gate flash cells, not to the CMOS circuitry.

The first implant parameters and second implant parameters are different with a difference (e.g., a dose difference) that results in different dopant distributions in the first and second pocket regions which reduces a variation in Ir for the split-gate flash cell between measuring Ir using the first select gate and measuring Ir using the second select gate. It is recognized that program-state reading current is comparatively very small, and thus the even/odd select gate Ir difference is generally negligible, while the erase state has higher reading current, so that select gate CD differences may generate relatively significant Ir differences, such as a few μAs (see the Examples described below).

Figure 2A:
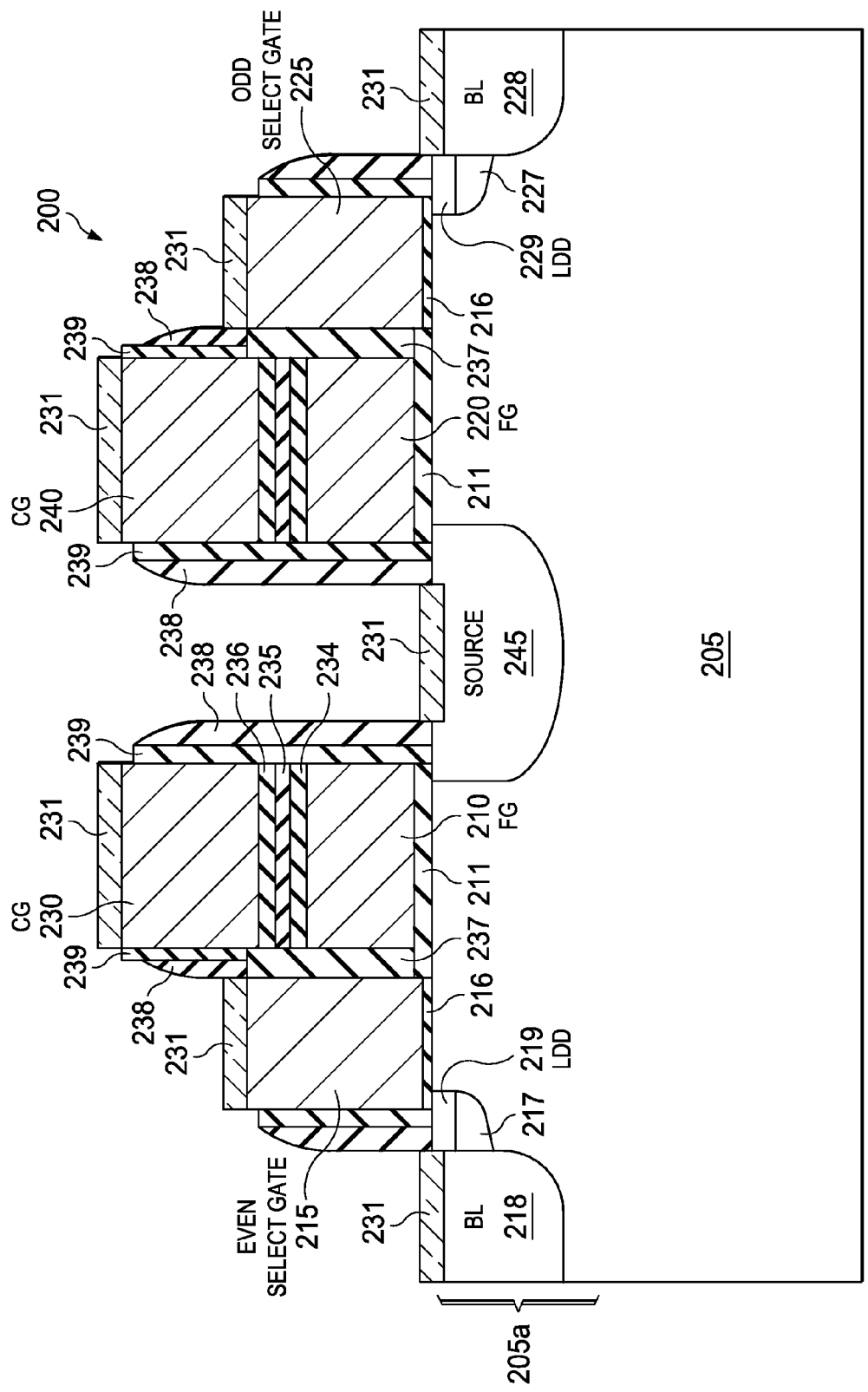
FIG. 2A is a cross sectional depiction of an example feed-forward bidirectional pocket implanted split-gate flash cell, according to an example embodiment.

FIG. 2A is a cross sectional depiction of an example feed-forward bidirectional pocket implanted split-gate flash cell 200, according to an example embodiment. Contacts and the metallization stack over the split-gate flash cell 200 are not shown. Split-gate flash cell 200 includes a substrate 205 having a semiconductor surface 205a. A first FG 210 and second FG 220 are on a tunnel gate dielectric layer 211 on the semiconductor surface 205a. A first control gate (CG) 230 is on the first FG 210 and a second CG 240 is on the second FG 220, where there is a dielectric stack between the CGs and FGs comprising a first dielectric layer 234, second dielectric layer 235 and a third dielectric layer 236.

A common source or common drain 245 is in the semiconductor surface 205a between the first FG 210 and second FG 220 shown having a silicide layer 231 thereon. The silicide layer 231 is also shown on first CG 230, second CG 240, the first select gate 215 shown as an "even select gate" and second select gate 225 shown as an "odd select gate", which will generally be the case when these gate comprise polysilicon gates.

The first select gate 215 and second select gate 225 are on a select gate dielectric layer 216 between a first BL source or drain (S/D) 218 in the semiconductor surface 205a and the first FG 210 and between a second BL S/D 228 in the semiconductor surface 205a and the second FG 220, respectively.

The select gate dielectric layer 216 can comprise a high-k dielectric layer being defined as a material with a dielectric constant κ of at least 5 compared to that of silicon dioxide being about 3.9. There is a spacer comprising the third dielectric layer 238 (e.g., silicon nitride) on the second dielectric layer 239 (e.g., silicon oxide) that provides electrical isolation between the silicide layer 231 over the source from the first and second FGs 210, 220 and the first and second BLs 218, 228 from the first and second select gates 215 and 225. There is also a fourth dielectric layer 237 under the spacer between the CGs/FGs and select gates.

The first select gate 215 has a first pocket region 217 that has a first doping distribution different from a second doping distribution in a second pocket region 227 associated with the second select gate 225 which reduces a variation in Ir for the split-gate flash cell 200 between measuring Ir using the first select gate 215 and measuring Ir using the second select gate 225. There is also shown a first lightly doped drain (LDD) region 219 associated with the first select gate 215, and a second LDD region 229 associated with the second select gate 225.

Figure 2B:
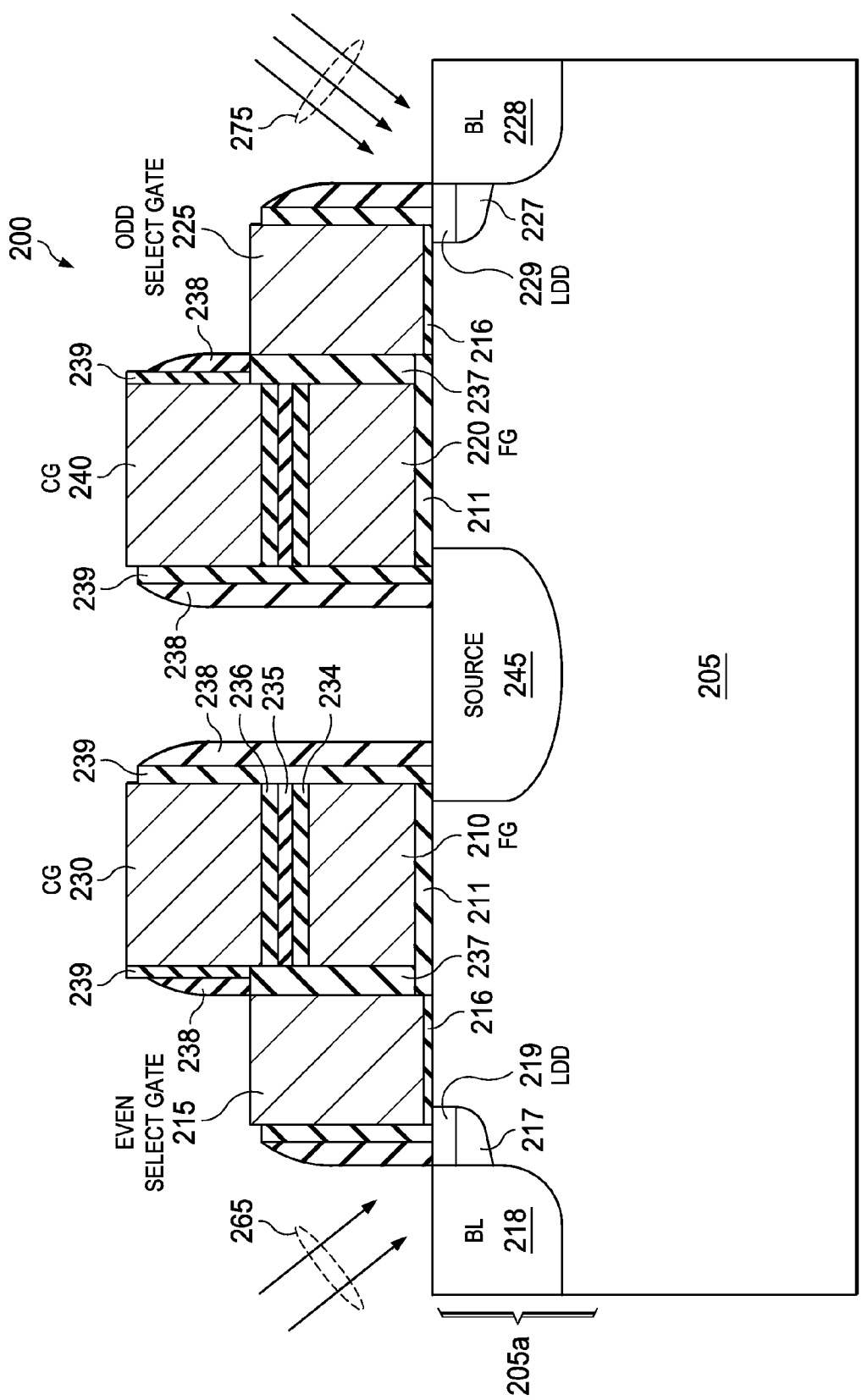
FIG. 2B is a cross sectional depiction of the feed-forward bidirectional pocket implanted split-gate flash cell shown in FIG. 2A with the silicide layer removed depicting the respective angled pocket implants with arrows provided to show example angles that make up the bi-directional pocket implant.

FIG. 2B is a cross sectional depiction of the feed-forward bidirectional pocket implanted split-gate flash cell 200 shown in FIG. 2A with the silicide layer 231 removed with arrows provided to show example angles depicting the respective angled pocket implants that make up the bi-directional pocket implant. The first pocket implant 265 uses first implant parameters and is implanted into a first pocket region associated with the first select gates shown as even select gate 215, and a second pocket implant 270 uses second implant parameters that is implanted into a second pocket region associated with the second select gates shown as odd select gate 225. The different number of arrows shown for first pocket implant 265 and second pocket implant 275 is provided to indicate an implant dose difference between the two implants. As described above, the polysilicon gates can act as an implant mask (so there is no need for photoresist) to block the first pocket implant 265 from entering the second pocket region associated with the second select gates shown as odd select gate 225, and block the second pocket implant 275 from entering the first pocket region associated with the first select gates shown as the even select gate 215.

Figure 3:
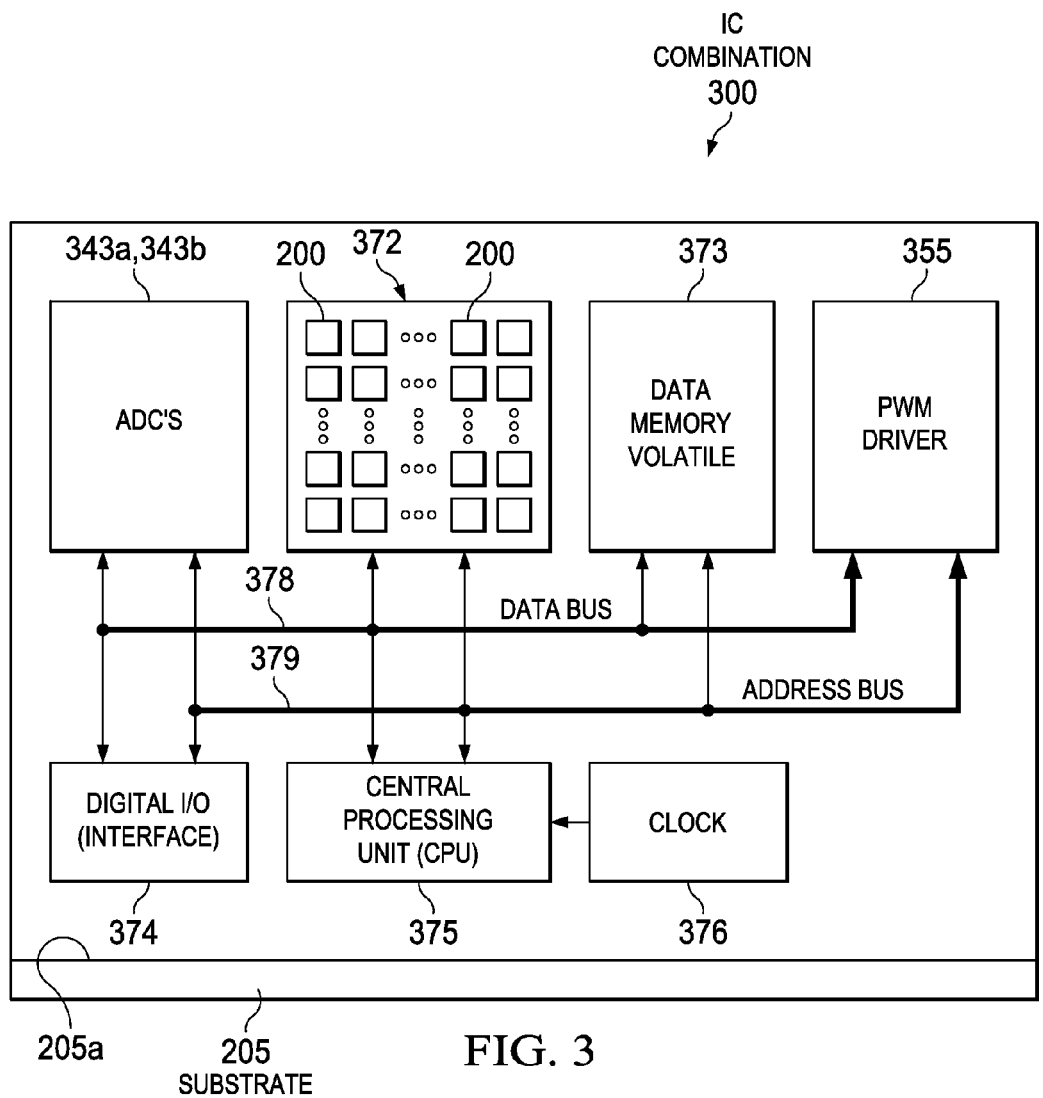
FIG. 3 is a block diagram depiction of a monolithic IC processor chip combination including a non-volatile memory comprising an array of interconnected feed-forward bidirectional pocket implanted split-gate flash cells, according to an example embodiment.

FIG. 3 is a block diagram depiction of a monolithic IC processor chip combination (IC combination) 300 formed in and on a semiconductor surface 205a of a substrate 205 including a non-volatile memory 372 comprising an array of interconnected disclosed bidirectional pocket implanted split-gate flash cells 200, according to an example embodiment. The connection between the split-gate flash cells 200 can be in parallel to the bit lines so that each cell can be read/written/erased individually, or connected in series. On-chip flash memory is perhaps the most important memory element in any application since it is most often the source for all the instructions for the central processing unit (CPU or processor) 375. If instructions are not fetched efficiently, the overall processor performance will likely suffer. The IC combination 300 can comprise a microprocessor, digital signal processor (DSP) or microcontroller unit (MCU).

Although not shown, the IC combination 300 generally includes other integrated circuit modules, for example, a Universal Serial Bus (USB) controller and a transceiver. IC combination 300 is shown also including volatile data memory 373, digital I/O (interface) 374, and clock (or timer) 376. IC processor chip combination 300 is also shown including a digital data bus 378 and an address bus 379.

EXAMPLES

Disclosed embodiments are further illustrated by the following specific Examples, which should not be construed as limiting the scope or content of this Disclosure in any way.

Figure 4:
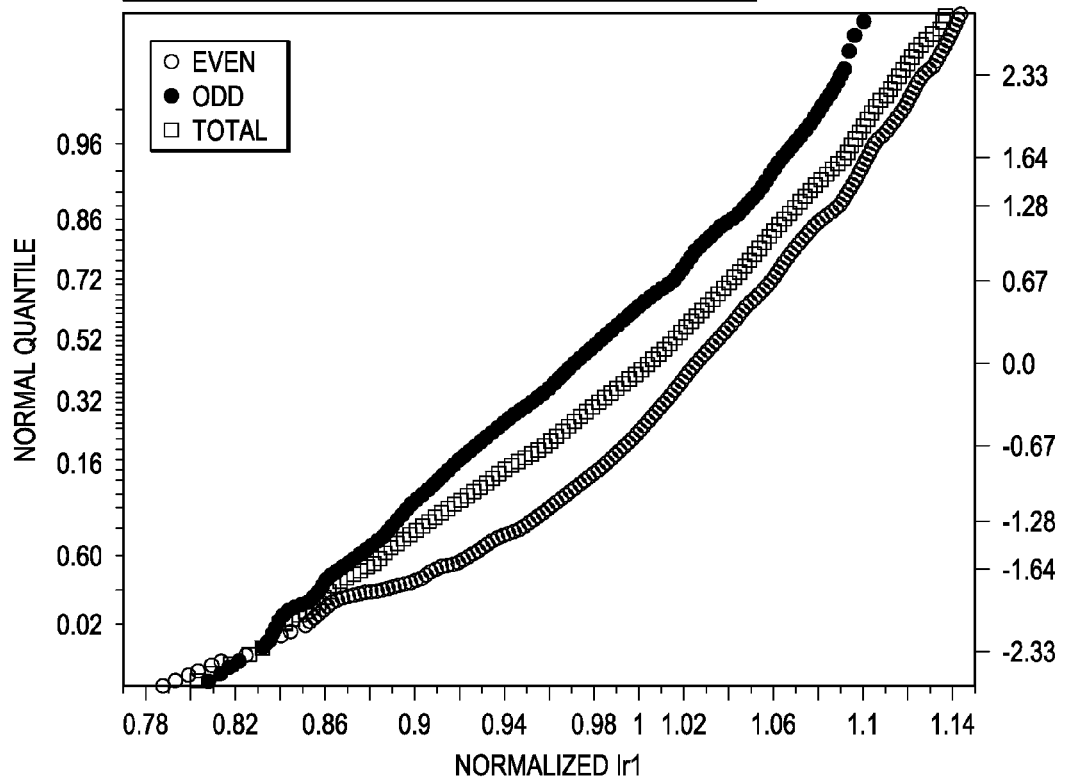
FIG. 4 shows normalized Ir distribution data for cells across a wafer for even odd select gate reads in table and plot form at the erased state using a BL reading voltage of 1.2V and a 12.5 V erase voltage.

FIG. 4 shows normalized Ir distribution data for flash cells across a wafer being actual data with normalization for even odd select gate reads in table and plot form at the erased state after applying a 12.5V erase voltage for 45 ms. The y-axis in the plots is the normal quantile. The even and odd select gate flash cell average Ir readings are both different by only about 5%. This difference is recognized to be mainly due to the select gate (e.g., polysilicon) CD difference between even and odd select gates.

Select gate photo alignment error to the FG or CG on FG stack generates even and odd select gate (e.g., polysilicon gate) CD variation. The alignment error as described above can be converted to even and odd select gate CD or directly the odd/even select gate CD variation can be directly measured in-line, and based on in-line even and odd select gate CD the subsequent bidirectional pocket implant doses can be adjusted to be different doses. For example, longer select gates (odd select gates for example) can receive a lighter pocket implant dose, while shorter select gates (even select gates for example) can receive a heavier pocket implant dose, such as about 5% more.

The pocket implant (e.g., dose) differences can be applied to all the wafers in the entire lot, or each wafer can receive a customized pocket implant. Thus select gate even and odd average Ir difference can be decreased and produce a combined a split-gate flash cell distribution with a reduced standard deviation. As a result, the even select gate CD and odd select gate CD average Ir difference is decreased and combined split-gate flash cell Ir distribution has lower standard deviation. Tightened erased split-gate flash cell Ir distribution improves flash design and process margins.

Figure 5:
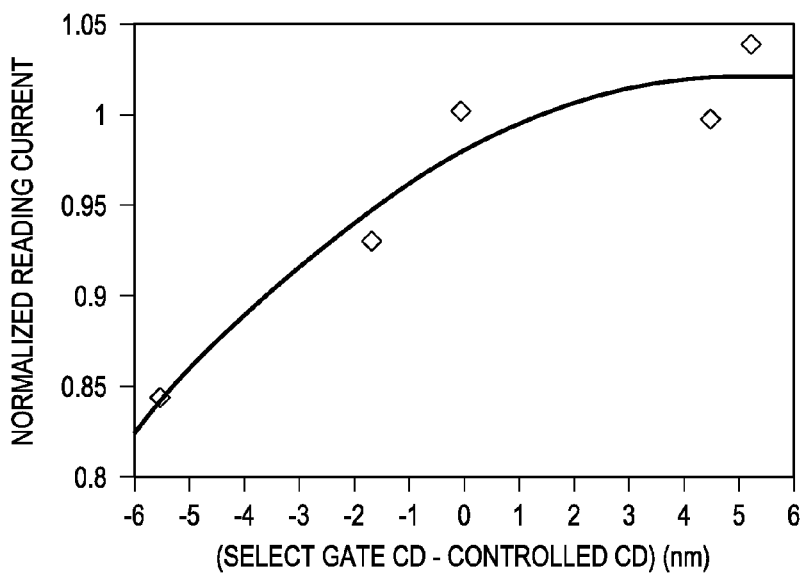
FIG. 5 is a plot of normalized Ir vs. select gate CD that evidences for the particular split-gate flash cell design tested, Ir monotonically increases with increasing select gate CD.

FIG. 5 is a plot of vs. normalized Ir vs. select gate CD that evidences for the particular split-gate flash cell design tested, Ir monotonically increases with increasing select gate CD. Other cell designs may have a reverse trend. In the case Ir monotonically increases with increasing select gate CD, the odd select gates can be pocket implanted with a higher dose as compared to the even select gates, such as a 2% to 8% higher dose in one particular example.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:
1. A split-gate flash memory cell (split-gate flash cell), comprising:
a substrate having a semiconductor surface;

a first control gate (CG) on a first floating gate (FG) and a second CG on a second floating gate (FG) each on a tunnel gate dielectric layer on said semiconductor surface;

a common source or common drain in said semiconductor surface between said first FG and said second FG, and a first select gate and a second select gate on a select gate dielectric layer between a first BL source or drain (S/D) in said semiconductor surface and said first FG and between a second BL S/D in said semiconductor surface and said second FG, respectively;

wherein said first select gate has a first pocket region that has a first doping distribution different from a second doping distribution in a second pocket region associated with said second select gate which reduces a variation in read current (Ir) for said split-gate flash cell between measuring said Ir using said first select gate and measuring said Ir using said second select gate.

2. The split-gate flash cell of claim 1, wherein said first select gate, said second select gate, said first CG, and said second CG each comprise polysilicon gates.

3. The split-gate flash cell of claim 1, wherein said first select gate, said second select gate, said first CG, and said second CG each comprise metal gates.

4. The split-gate flash cell of claim 1, wherein said first doping distribution and said second doping distribution differ in a total integrated dose by at least 2%.

5. The split-gate flash cell of claim 1, wherein a plurality of said split-gate flash cells are on said semiconductor surface, and are interconnected together and arranged in an array.

6. The split-gate flash cell of claim 1, wherein said split-gate flash cell comprises n-channel metal-oxide semiconductor (NMOS) transistors, and wherein said first pocket region and said second pocket region are both boron doped.

7. The split-gate flash cell of claim 1, wherein said substrate comprises silicon.

8. An integrated circuit (IC) combination, comprising:
a substrate having a semiconductor surface;
a processor formed on said semiconductor surface, and
an array of interconnected split-gate flash memory cells (split-gate flash cells) formed on said semiconductor surface, each said split-gate flash cell including:
a first control gate (CG) on a first floating gate (FG) and a second CG on a second floating gate (FG) each on a tunnel gate dielectric layer on said semiconductor surface;
a common source or common drain in said semiconductor surface between said first FG and said second FG, and
a first select gate and a second select gate on a select gate dielectric layer between a first BL source or drain (S/D) in said semiconductor surface and said first FG and between a second BL S/D in said semiconductor surface and said second FG, respectively;
wherein said first select gate has a first pocket region that has a first doping distribution different from a second doping distribution in a second pocket region associated with said second select gate which reduces a variation in read current (Ir) for said split-gate flash cell between measuring said Ir using said first select gate and measuring said Ir using said second select gate, and
a data bus for coupling said array of interconnected split-gate flash cells to said processor.

9. The IC combination of claim 8, wherein said first select gate, said second select gate, said first CG, and said second CG each comprise polysilicon gates.

10. The IC combination of claim 8, wherein said first doping distribution and said second doping distribution differ in a total integrated dose by at least 2%.

11. The IC combination of claim 8, wherein said IC combination comprises a microcontroller unit (MCU).

12. The IC combination of claim 8, wherein said split-gate flash cell comprises n-channel metal-oxide semiconductor (NMOS) transistors, and wherein said first pocket region and said second pocket region are both boron doped.

* * * * *